US006717536B2

(12) United States Patent
Jonsson

(10) Patent No.: US 6,717,536 B2
(45) Date of Patent: Apr. 6, 2004

(54) SELECTIVE BACKGROUND CALIBRATION FOR A/D CONVERTER

(75) Inventor: Bengt Erik Jonsson, Spånga (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 10/372,138

(22) Filed: Feb. 25, 2003

(65) Prior Publication Data

US 2003/0146863 A1 Aug. 7, 2003

Related U.S. Application Data

(63) Continuation of application No. PCT/SE01/01803, filed on Aug. 24, 2001.

(51) Int. Cl.$^7$ ................................................. H03M 1/10
(52) U.S. Cl. ........................ 341/120; 341/119; 341/121
(58) Field of Search ................................. 341/120, 119, 341/121

(56) References Cited

U.S. PATENT DOCUMENTS

| | | | | |
|---|---|---|---|---|
| 3,703,001 A | * | 11/1972 | Hibbs, Jr. | 341/120 |
| 4,133,036 A | * | 1/1979 | Watson | 341/120 |
| 5,101,206 A | * | 3/1992 | Riedel | 341/120 |
| 5,121,119 A | * | 6/1992 | Higuchi et al. | 341/120 |
| 5,450,336 A | * | 9/1995 | Rubsamen et al. | 341/120 |
| 6,069,576 A | * | 5/2000 | Gwin | 341/120 |
| 6,255,976 B1 | * | 7/2001 | Watanabe et al. | 341/120 |
| 6,414,612 B1 | * | 7/2002 | Quesenberry | 341/120 |
| 6,473,012 B2 | | 10/2002 | Hellberg et al. | |
| 6,496,125 B2 | | 12/2002 | Jonsson et al. | |

FOREIGN PATENT DOCUMENTS

EP        0 981 204 A2   2/2000

OTHER PUBLICATIONS

International Search Report mailed Dec. 10, 2001 in corresponding PCT application No. PCT/SE01/01803.
International Preliminary Examination Report completed Jul. 16, 2002 in corresponding PCT application No. PCT/SE01/01803.
Erdoğan et al, WA 18.1 –A 12b Digital–Background–Calibrated Algorithmic ADC with –90dB THD:, 1999, IEEE International Solid–State Circuits Conference.
Kwak et al, "A 15–b, 5–Msample/s Low–Spurious CMOS ADC", 1999, IEEE Journal of Solid–State Circuits, vol. 32, No. 12, Dec. 1997, pp. 1866–1875.
Razavi, "Design of Analog CMOS Integrated Circuits" Preview Edition, McGraw–Hill Higher Education.
Ming et al, "MP 2.5 –An 8b 80Msample/s Pipelined ADC with Background Calibration", 2000, ISSCC 2000/Session 2/Nyquist–Rate Data Converters/Paper MP 2.5, IEEE International Solid–State Circuits Conference.
Ingino et al, "A Continuously Calibrated 12–b, 10–MS/s, 3.3–V A/D Converter", IEEE Journal of Solid–State Circuits, vol. 33, No. 12, Dec. 1998, pp. 1920–1931.
Moon et al, "Background Digital Calibration Techniques for Pipelined ADC's", IEEE Transactions on Circuits and Systems –II; Analog and Digital Signal Processing, vol. 44, No. 2, Feb. 1997, pp. 102–109.

* cited by examiner

Primary Examiner—Michael Tokar
Assistant Examiner—Lam T. Mai
(74) Attorney, Agent, or Firm—Nixon & Vanderhye, P.C.

(57) ABSTRACT

An A/D converter calibration apparatus includes a set of operating condition parameter sensors (100) for detecting the current operating conditions, which are represented by parameters $x_1, \ldots, x_N$. The measured parameters are forwarded to an operating conditions change detector (102), which calculates a change measure and determines whether this measure exceeds a predetermined change threshold. When a change exceeding the threshold has been detected, a calibration trigger signal CAL_TRIG is passed to a calibration control unit (104), which initiates a background calibration sequence.

20 Claims, 7 Drawing Sheets

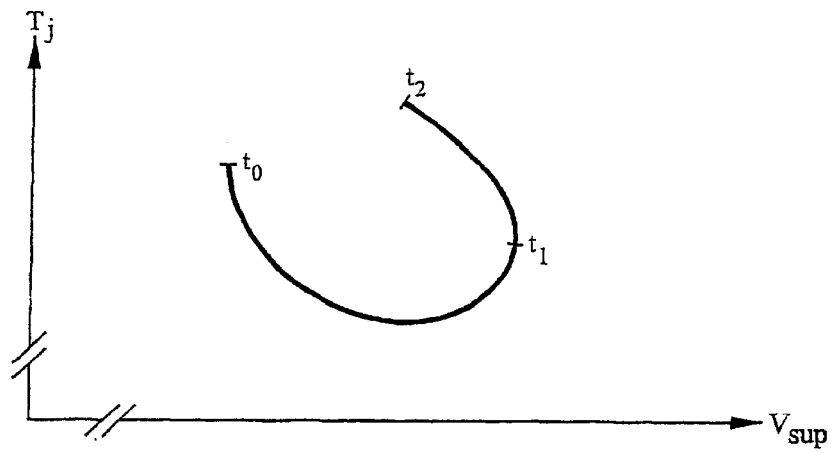
Fig. 4 PRIOR ART
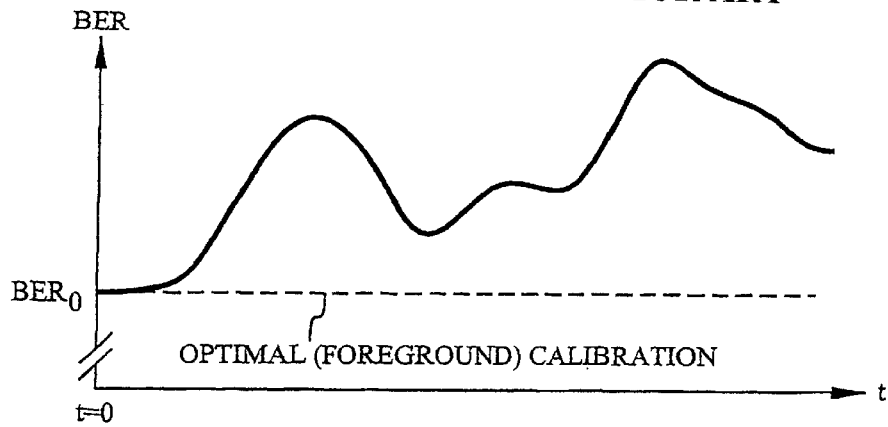
Fig. 5 PRIOR ART
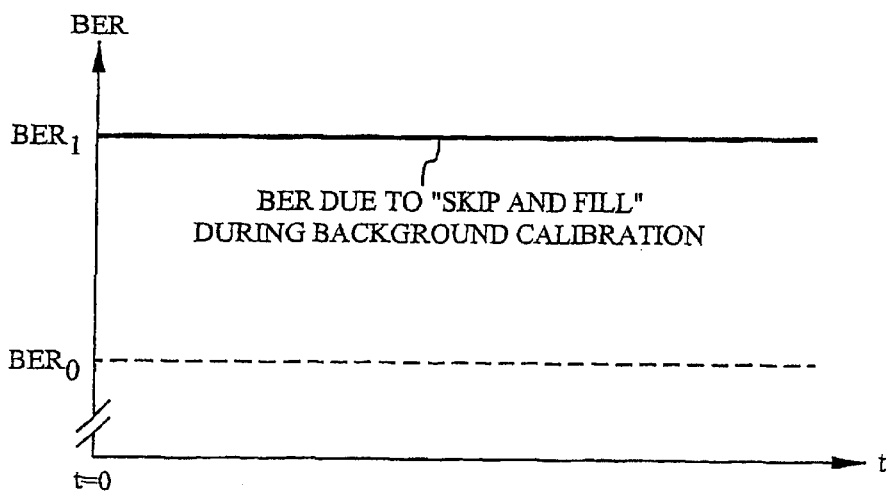
Fig. 6 PRIOR ART

TEMPERATURE SENSOR
(VOLTAGE-BASED)

TEMPERATURE SENSOR
(CURRENT-BASED)

BIAS CURRENT SENSOR

SUPPLY VOLTAGE SENSOR

SELECTIVE BACKGROUND CALIBRATION FOR A/D CONVERTER

This application is a continuation of international application PCT/SE01/01803 filed Aug. 24, 2001 which designates the U.S.

TECHNICAL FIELD

The present invention relates to analog-to-digital (A/D) converters, and in particular to background calibration of such converters.

BACKGROUND

The performance of any A/D converter is limited by non-ideal effects associated with its various building blocks. The influence of several such effects can be addressed by digital calibration, e.g. as described in [1], where a set of digital calibration coefficients are used to correct the estimated analog circuit errors. A problem is that the calibration coefficients are most accurate when the circuit is operated under exactly the same conditions as when the coefficients were estimated. If, for example, the temperature, the supply voltage, or a bias current is changed, a new set of coefficients may be required for optimal error correction.

Usually, a technique called background calibration [2] is used to continuously calibrate the A/D converter during normal operation. However, the background calibration process disturbs the normal signal flow through the A/D converter, and therefore causes an error in the output. There are techniques to reduce the magnitude of such errors, e.g. by interpolation as described in [3]. Nevertheless, the signal interrupts caused by background calibration of the A/D converter lead to an increased bit-error rate in, for example, digital communication systems. It would be desirable, both from a signal quality and power efficiency point of view, to avoid background calibration of the A/D converter whenever possible.

SUMMARY

An object of the present invention is to provide background calibration techniques for A/D converters at a lower bit-error rate penalty than in the prior art.

This object is achieved in accordance with the attached claims.

Briefly, the present invention is based on the insight that background calibration is normally not necessary during times when operating conditions are stable. By using on-chip or off-chip sensors for critical operating parameters, such as temperature and supply voltage, it becomes possible to suppress unnecessary background calibration under stable operating conditions, thus lowering the bit-error rate in steady-state.

BRIEF DESCRIPTION OF THE DRAWINGS

The invention, together with further objects and advantages thereof, may best be understood by making reference to the following description taken together with the accompanying drawings, in which:

FIG. 4 is a diagram illustrating how operating conditions may change over time;

FIG. 5 is a time diagram illustrating the behavior of the system level bit-error rate after an initial A/D converter foreground calibration;

FIG. 6 is a time diagram illustrating the behavior of the system level bit-error rate when using A/D converter background calibration;

DETAILED DESCRIPTION

Figure 1:
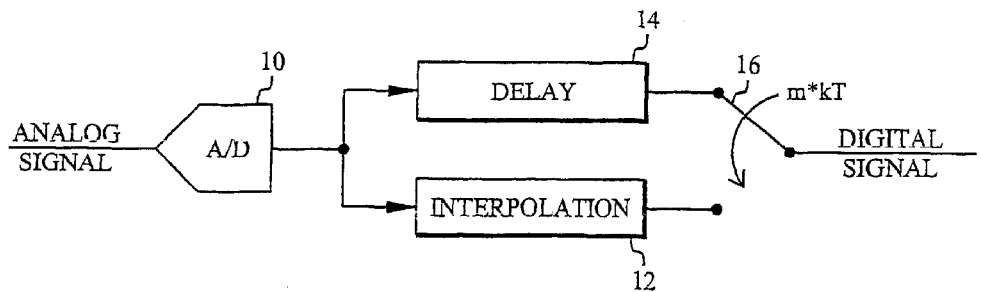
FIG. 1 is a block diagram of a conventional A/D converter with an interpolator.
Figure 2:
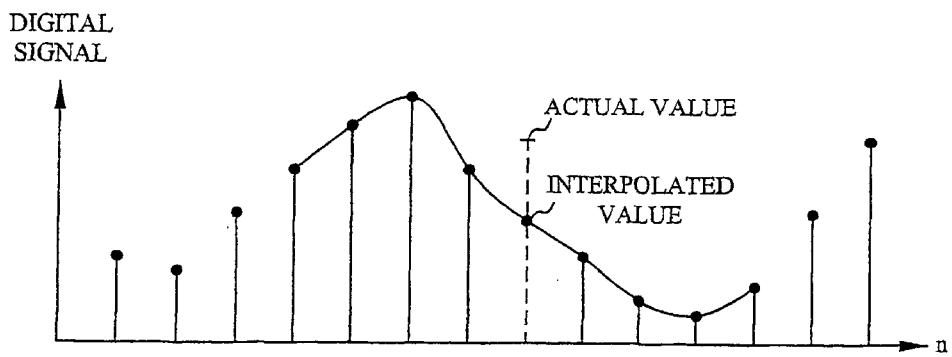
FIG. 2 is a time diagram illustrating sampling with the A/D converter of FIG. 1.

One of the more popular approaches to background calibration is to use the "skip-and-fill" approach [3, 4], as illustrated in FIGS. 1 and 2.

FIG. 1 is a block diagram of a conventional A/D converter with an interpolator. An analog signal is forwarded to an A/D converter 10. The digital samples are forwarded to an interpolator 12 and a delay element 14. A switch 16 is normally in the indicated upper position, in which the digital samples from delay element 14 are outputted at a sampling interval T. Every $k^{th}$ sample switch 16 is forced to its lower position, in which a sample is skipped and an interpolated digital sample from interpolator 12 is outputted instead. Thereafter switch 16 returns to its upper position. Calibration, or a part of a complete calibration of A/D converter 10 is performed during the interpolation. This operation is repeated periodically.

FIG. 2 is a time diagram illustrating sampling with the A/D converter of FIG. 1. The dashed line denotes the actual value of the skipped sample. Due to the limited bandwidth of the interpolation, the interpolated value may be different from this actual value. The interpolated value lies on the illustrated interpolation curve that is formed by surrounding samples. These surrounding samples are the reason for delay element 14 in FIG. 1 (in order to be able to interpolate, samples are required both before and after the skipped sample).

Figure 3:
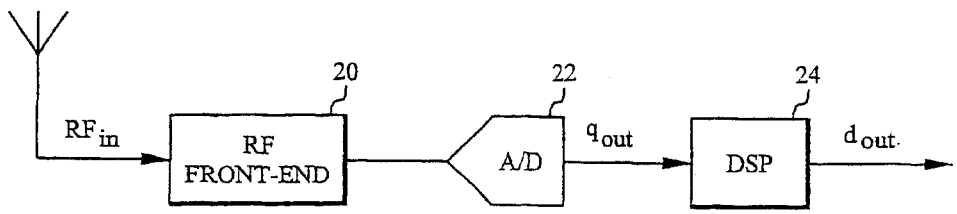
FIG. 3 is a simplified block diagram of a typical digital radio system.

A digital radio system example is shown in FIG. 3. An analog radio frequency (RF) signal is received and converted to baseband by means of an RF front end 20. The baseband signal is then digitized by an A/D converter 22, and further processed in digital form by a digital signal processing (DSP) unit 24. The transmission quality can be measured in terms of the bit-error rate (BER) of the digital output signal $d_{out}$. Transmission quality is usually limited by the performance of the RF front end and the A/D converter.

The A/D-converter performance is influenced by a combination of static errors, such as component mismatch, and a number of parameters representing its operating conditions. Examples of such parameters are temperature, supply voltage, and bias currents. Since an operating range is usually defined for each parameter, a one-dimensional or multi-dimensional operating space is formed. As an example, the two-dimensional operating space for junction temperature $T_j$, and supply voltage $V_{sup}$, is shown in FIG. 4. A simultaneous change in these two parameters over time is illustrated by the curve (time increases from $t_0$ to $t_2$).

The influence of component mismatch and fluctuating operating conditions can be reduced, e.g. by digital calibration. A problem is that efficient digital calibration of A/D-converters requires calibration coefficients to be updated whenever operating conditions have changed. Such re-calibration can be done in the foreground or in the background.

Foreground calibration completely blocks the data flow through the A/D converter until the calibration sequence is completed. In a digital radio system, this would stop all traffic during the entire calibration sequence. Such interrupts are unacceptable in any normal mode of operation, and thus fore-ground calibration can only be used at start-up or when the A/D converter is off-line. Background calibration is therefore used in the prior-art to solve this problem.

Background calibration also disturbs the signal flow in the A/D converter, although not as much as foreground calibration does. The loss in signal quality is a function of the accuracy of the fill samples, and the spacing between them. A larger fill sample spacing results in less error energy in a sample sequence of a certain length. However, if the fill sample spacing is too large, the background calibration will not efficiently track rapid changes in operating conditions.

The difference between foreground and background calibration from a system-level point-of-view is illustrated in FIGS. 5 and 6.

A foreground calibration approach can find the optimal set of calibration coefficients at start-up (t=0). This is represented at system level by the low bit error rate $BER_0$. As operating conditions change over time, so does the bit-error rate, and this uncontrolled variation can be fairly large as indicated in FIG. 5.

Background calibration involves continuously repeating a calibration sequence, in which A/D conversion is interrupted for a predetermined number of sample positions and the skipped samples are replaced by fill samples, which are typically obtained by interpolation. Using a relatively dense background calibration sequence can stabilize the bit error rate even under rapid changes in operating conditions. This is illustrated in FIG. 6, where the bit-error rate is essentially constant. However, due to the "skip-and-fill" operation in background calibration, there is an increase in the lowest attainable bit-error rate—from the optimum $BER_0$ to $BER_1$—determined by the density of the background calibration sequence and the accuracy of the fill samples.

In the prior art, the background calibration sequence is continuously repeated, whether it is needed or not. However, under stable operating conditions, there is actually no need to continuously re-calibrate the A/D converter. Although the fill sample error can be made small, it still represents an unnecessary A/D-conversion error. Therefore background calibration should be suppressed as much as possible when operating conditions are stable.

Figure 7:
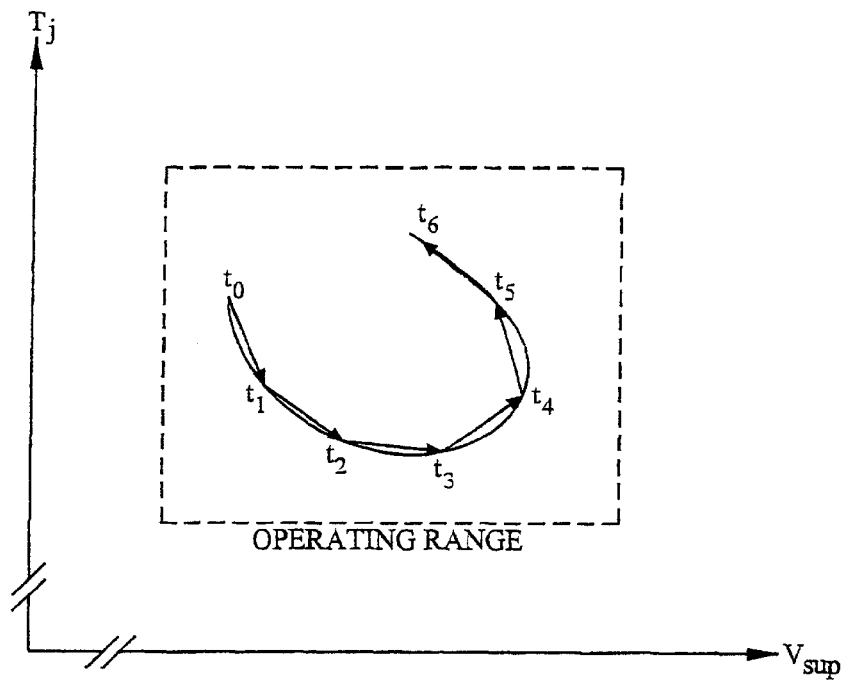
FIG. 7 is diagram illustrating an exemplary method of tracking changes in operating conditions.

The present invention solves the problems with continuous background calibration by tracking the changes in operating conditions and initiating a background calibration sequence essentially only when conditions have changed sufficiently to motivate a re-calibration. FIG. 7 is a diagram corresponding to FIG. 4 and illustrating an exemplary method of tracking changes in operating conditions. Each operating condition parameter is considered as a vector component, and a calibration sequence is initiated whenever a continuously measured difference vector, which represents the change in operating conditions since the last calibration initiation, exceeds a predetermined threshold magnitude. In FIG. 7 this has been indicated by equal magnitude difference vectors connecting re-calibration instants $t_0$–$t_6$.

There are several possible ways to define the magnitude of such a difference vector. One possibility is $$\Delta x = \sqrt{\sum_{i=1}^{N} c_i (\Delta x_i)^2}$$

where
- $\Delta_x$ is the magnitude of the difference vector,
- $\Delta_{xi}$ are the changes in operating condition parameters,
- N is the number of operating condition parameters, and
- $c_i$ are weighting coefficients that account for the relative importance of different parameters.

Another possibility is $$\Delta x = \sqrt{\sum_{i=1}^{N} c_i \left| \Delta x_i \right|}$$

Still another possibility is $$\Delta x = \max_i (c_i | \Delta x_i |)$$

In the last mentioned example a calibration sequence is initiated if the (weighted) magnitude of the change in at least one of the parameters has exceeded the threshold.

Figure 8:
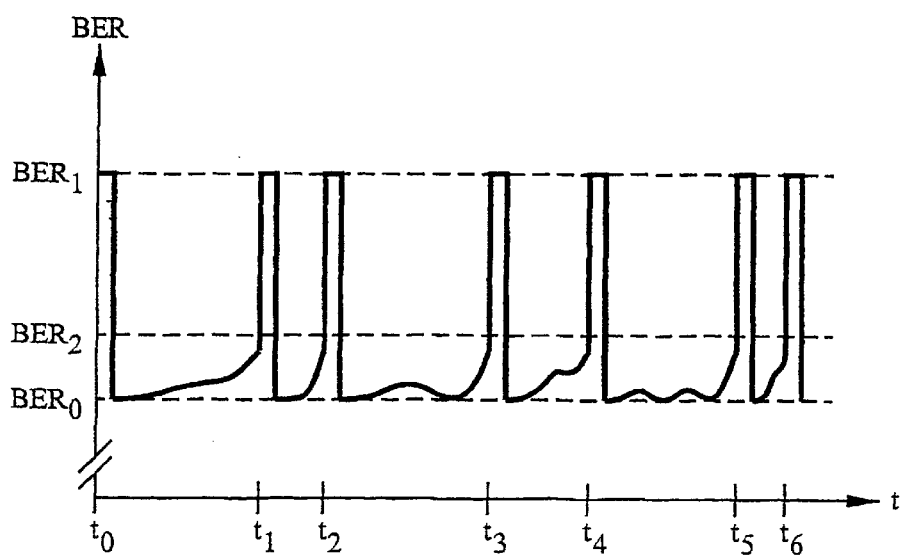
FIG. 8 is a time diagram illustrating the behavior of the system level bit-error rate in an exemplary embodiment of the present invention.

FIG. 8 is a time diagram illustrating the behavior of the system level bit-error rate in an exemplary embodiment of the present invention. It is noted that during calibration sequences the bit-error rate is the same as in FIG. 6, namely $BER_1$. However, after each calibration sequence the bit-error rate is lowered to the optimal rate $BER_0$. Since re-calibrations is only performed when operating conditions have changed sufficiently since the last re-calibration, it is appreciated that the average bit-error rate $BER_2$ will lie between $BER_0$ and $BER_1$.

Figure 9:
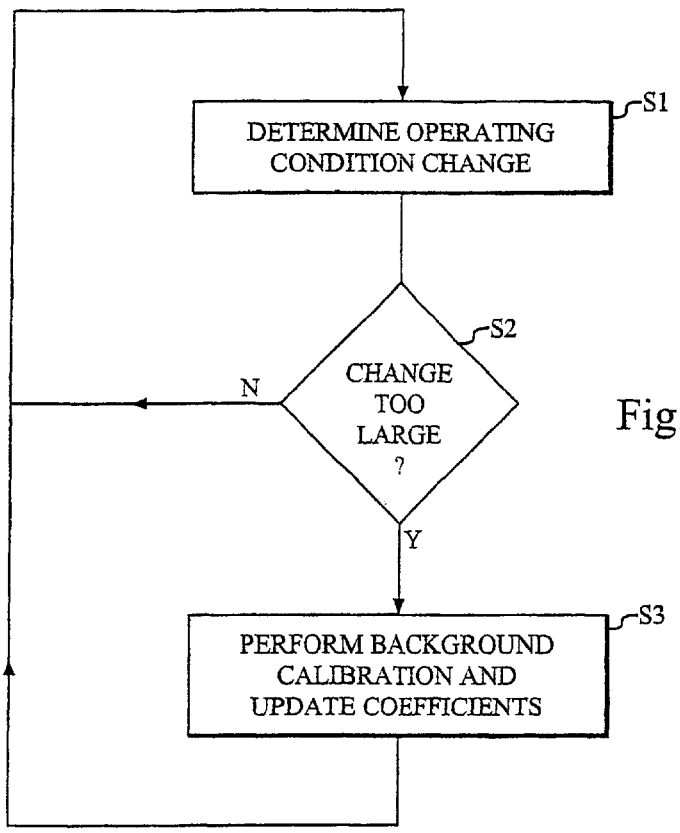
FIG. 9 is a flow chart illustrating an exemplary embodiment of the A/D converter calibration method in accordance with the present invention.

FIG. 9 is a flow chart illustrating an exemplary embodiment of the method of the present invention. Step S1 determines the change in operating conditions by determining and combining the operating parameter changes, for example in accordance with one of the equations above. Step S2 determines whether the change exceeds a predetermined threshold. If not, the procedure returns to step S1. Otherwise step S3 initiates a background calibration sequence and updates the calibration coefficients. Thereafter the procedure returns to step S1. Typically step S1 is repeated at regular intervals having at least the length of a calibration sequence.

Figure 10:
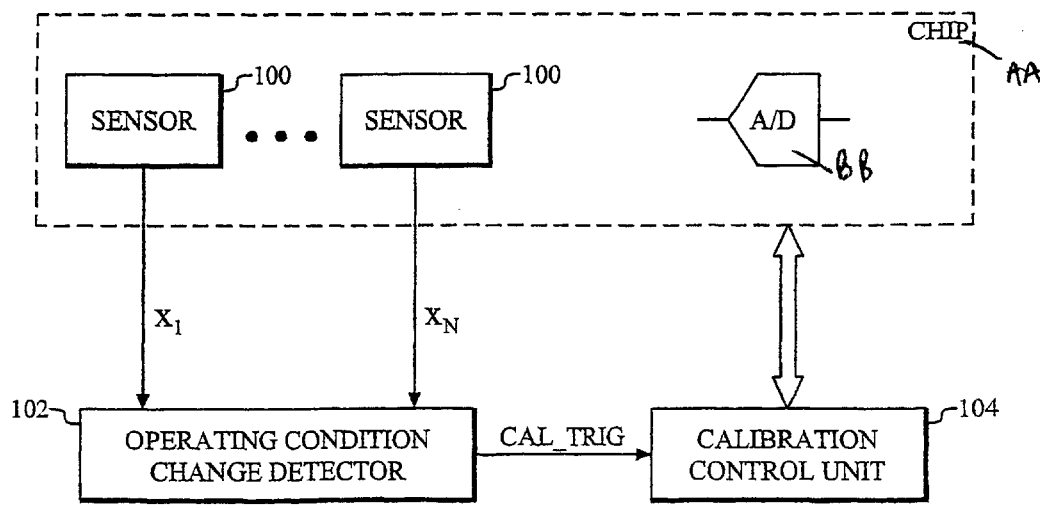
FIG. 10 is a block diagram illustrating an exemplary embodiment of an A/D converter calibration apparatus in accordance with the present invention.

FIG. 10 is a block diagram illustrating an exemplary embodiment of an A/D converter calibration apparatus in accordance with the present invention. A set of operating condition parameter sensors 100 detect the current operating conditions, which are represented by parameters $x_1, \ldots, x_N$. In this embodiment the sensors 100 are assumed to be integrated on the same chip as the A/D converter itself. However, embodiments where some or all sensors are provided separately from the chip are also feasible. The measured parameter are forwarded, in analog or digital form, to an operating conditions change detector 102, which determines a change measure, for example in accordance with one of the above equations, and determines whether this measure exceeds a predetermined change threshold. When a change exceeding the threshold has been detected, a calibration trigger signal CAL_TRIG is passed to a calibration control unit 104, which initiates a background calibration sequence. In the embodiment of FIG. 10 change detector 102 and control unit 104 are illustrated as being outside of the A/D converter chip. However, embodiments where one or both of these elements are integrated with the A/D converter itself are equally feasible. When placed outside the A/D converter chip, change detector 102 may be implemented using a micro processor, signal processor or field-programmable gate-array (FPGA). When placed on the chip, it may be implemented as an application-specific digital circuit.

Since there is actually no need to accurately detect absolute parameter values, the operating conditions can be detected with simple on-chip or off-chip devices, having a low power dissipation. The only requirement is that relative changes can be detected with sufficient resolution and speed. As an example, assume that temperature changes of 0.1° C. or less are to be detected within a temperature range of 0–90° C. It is then possible to use a 10 bit A/D converter for a nominal quantization range of −5 to +95° C. This corresponds to a temperature resolution of 0.1° C. A possible displacement of the temperature scale of a few ° C. due to, for example, variations in the production of the sensors is normally acceptable.

Figure 11:
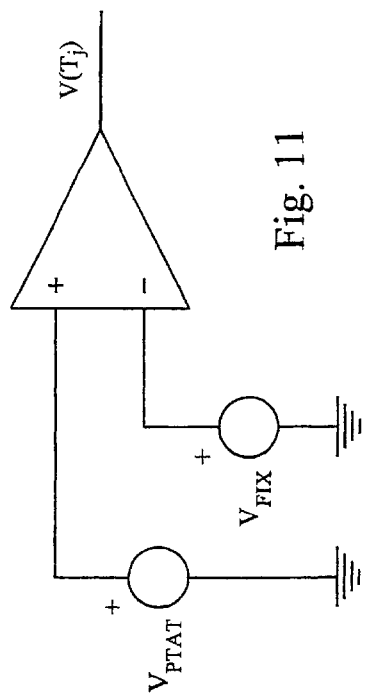
FIG. 11 illustrates an exemplary embodiment of a junction temperature sensor.

FIG. 11 illustrates an exemplary embodiment of a junction temperature sensor. In this embodiment temperature is detected by a voltage reference $V_{PTAT}$ that is "Proportional To Absolute Temperature" (PTAT) and a voltage reference $V_{FIX}$ that is independent of temperature and possible also of supply voltage.

Figure 12:
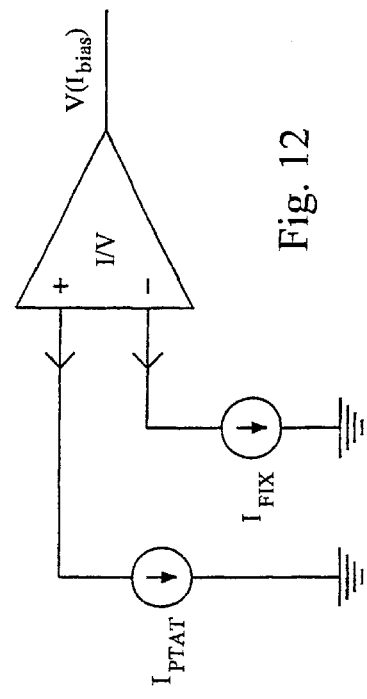
FIG. 12 illustrates another exemplary embodiment of a junction temperature sensor.

FIG. 12 illustrates another exemplary embodiment of a junction temperature sensor. In this embodiment the voltage references in FIG. 11 have been replaced by corresponding current references.

Figure 13:
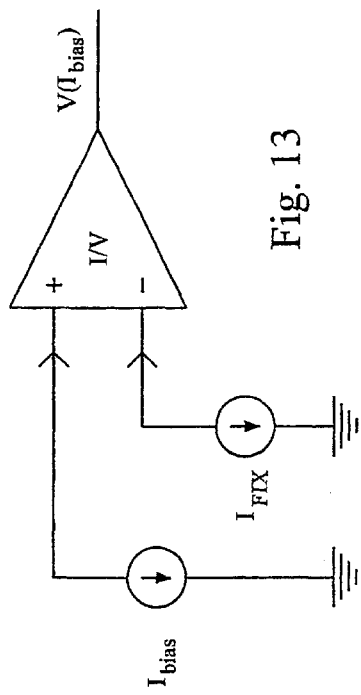
FIG. 13 illustrates an exemplary embodiment of a bias current sensor.

FIG. 13 illustrates an exemplary embodiment of a bias current sensor. In this embodiment bias current variations may be detected by comparing a copy of the monitored bias current to a constant reference current.

Figure 14:
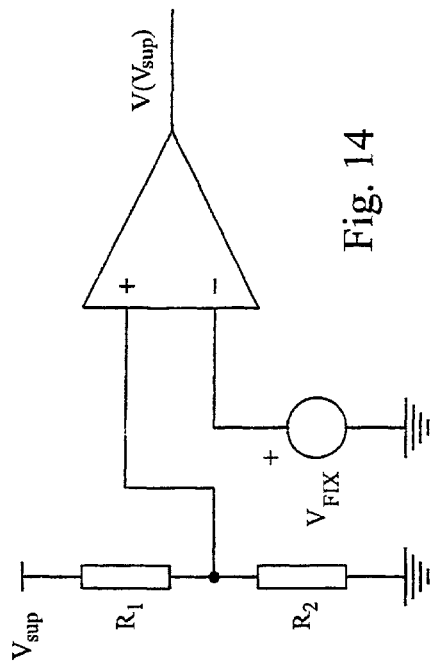
FIG. 14 illustrates an exemplary embodiment of a supply voltage sensor.

FIG. 14 illustrates an exemplary embodiment of a supply voltage sensor. In this embodiment voltage variations are detected by dividing the supply voltage over two resistors and comparing the resulting divided voltage to a constant reference voltage, for example from a band gap reference of 1.25 V.

Further details on implementation of the sensor embodiments described with reference to FIGS. 11–14 may be found in [5], which describes PTAT and constant voltages and currents in detail.

Figure 15:
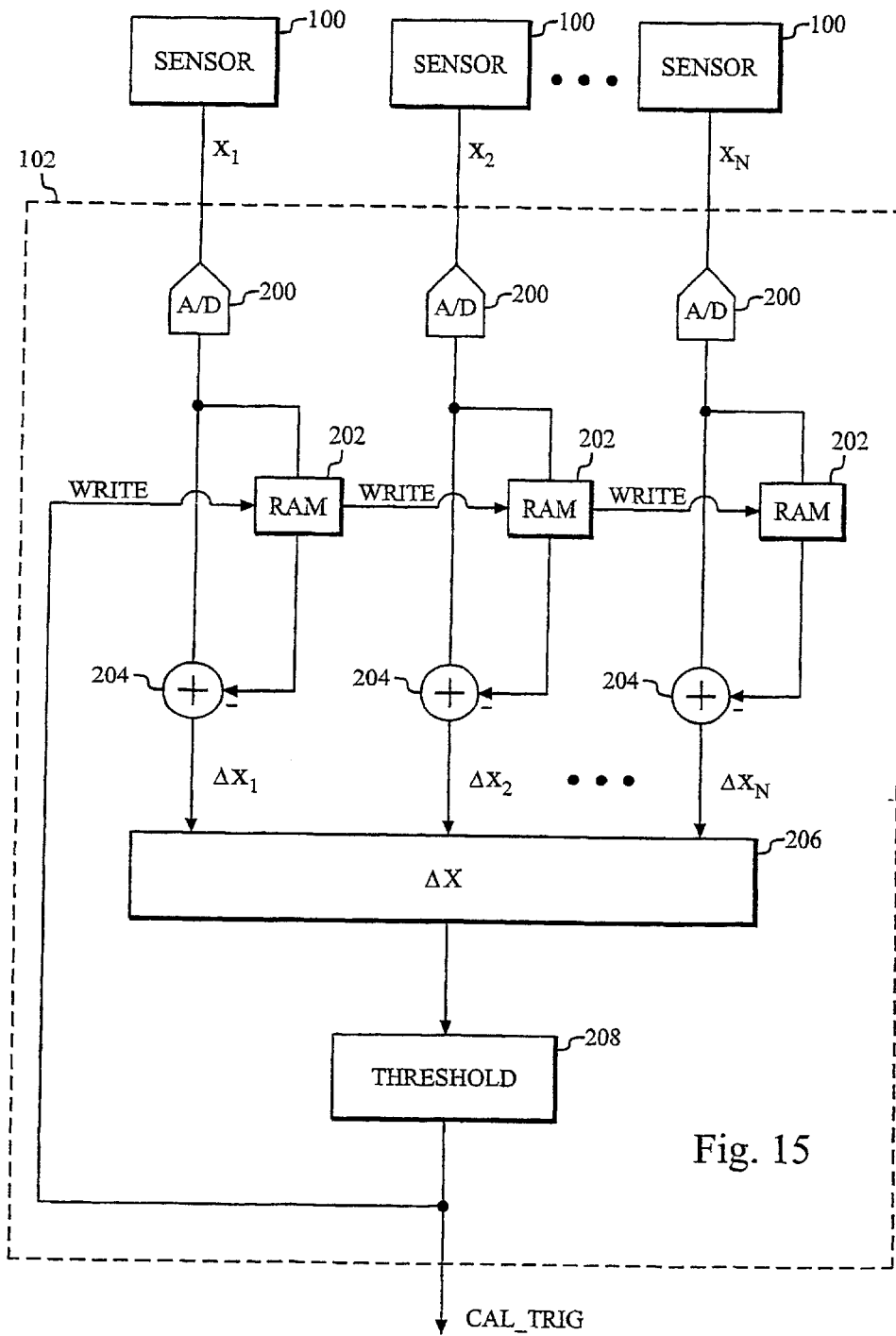
FIG. 15 is a block diagram illustrating an exemplary embodiment of an operating condition change detector.

FIG. 15 is a block diagram illustrating an exemplary embodiment of an operating condition change detector. The measured parameter values from sensors 100 are forwarded to a set of A/D converters 200. The digitized values are forwarded to RAM cells 202 and to adders 204. Adders 204 form the differences between the measured parameter values and the value stored in RAM cells 202 at the previous calibration start. A unit 206 determines a change measure, for example in accordance with one of the equations above. This change measure is forwarded to a threshold unit 208. If the change measure exceeds the threshold, a CALIB_TRIG signal is generated. This signal initiates another calibration sequence and also enables writing of the current sensor values into RAM cells 202.

Figure 16:
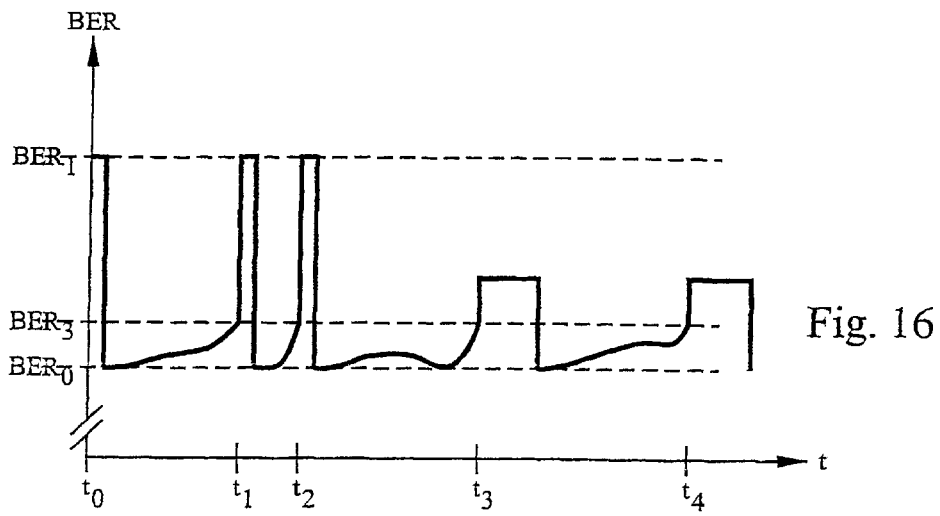
FIG. 16 is a time diagram illustrating the behavior of the system level bit-error rate in another exemplary embodiment of the present invention.

FIG. 16 is a time diagram illustrating the behavior of the system level bit-error rate in another exemplary embodiment of the present invention. This embodiment is based on the same principle as the embodiment in FIG. 7, namely to initiate background calibration only when operating conditions have changed sufficiently. However, in the embodiment of FIG. 16 the calibration sequence is stretched out in time (larger spacing between fill samples) if operating conditions only change slowly, as indicated at $t_3$ and $t_4$. This will lower the bit-error rate during these calibrations, thereby further lowering the average bit-error rate to $BER_3$. Similarly, it is also possible to compress the calibration sequence in time in order to counteract more rapid changes in operating conditions by a more frequent re-calibration, at the price of a slightly higher bit-error rate.

Figure 17:
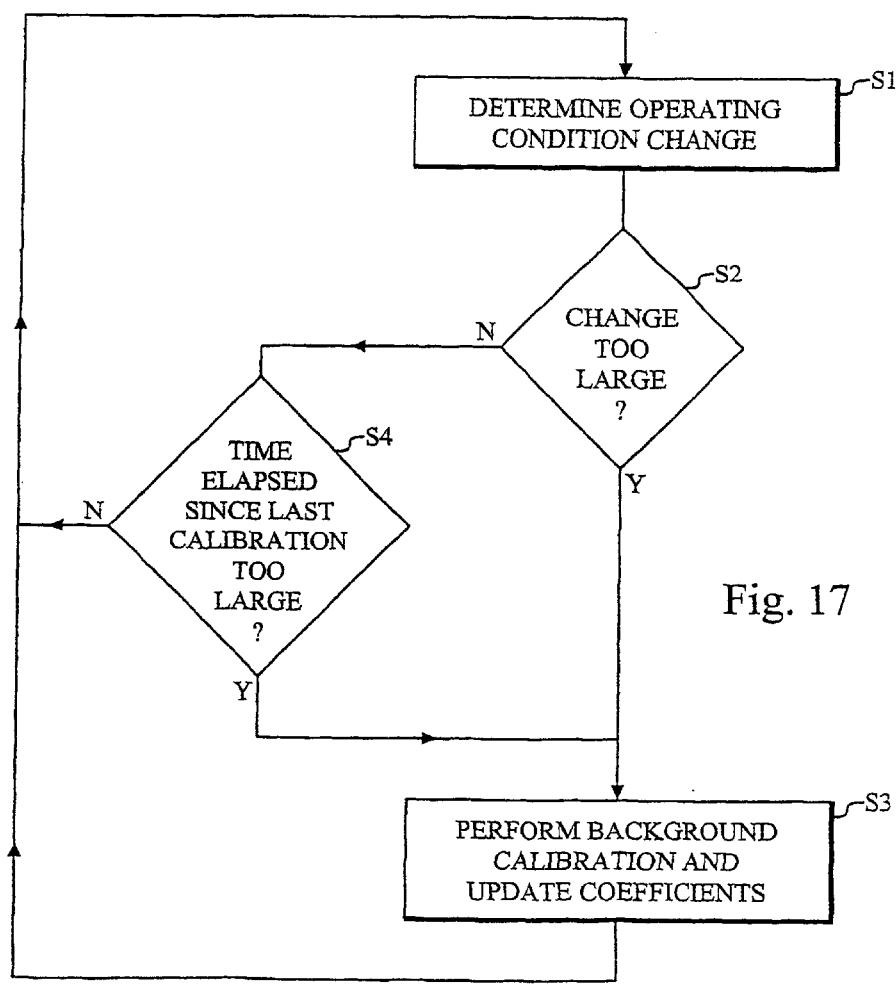
FIG. 17 is a flow chart illustrating another exemplary embodiment of the A/D converter calibration method in accordance with the present invention.

In the description above it has been assumed that only sufficient changes in operating conditions can initiate a re-calibration. However, in some situations it may be desirable to initiate a re-calibration if the measured operating condition parameters have been quite constant for a (very long) predetermined time period. One reason for such re-calibration may be that other parameters that influence the A/D converter performance, but are difficult to measure, may have changed. The mentioned time period is typically much longer than a calibration sequence. FIG. 17 is a flow chart illustrating an exemplary embodiment of the A/D converter calibration method in accordance with the present invention implementing this feature. FIG. 17 is similar to FIG. 9, but has the added step S4, which tests whether the time that has elapsed since the last calibration is too large. If this is the case, a re-calibration is initiated in step S3. Otherwise the procedure returns to step S1. A measure of the elapsed time may, for example, be obtained by counting the number of times step S1 has been performed since the last calibration. A background calibration may then be initiated if this value exceed a predetermined integer value, for example 5000–20000 measurement cycles, depending on the application.

The activation of background calibration could also be based on the sensing of a system-level detectable performance parameter, such as bit-error or transfer-error rates. These parameters may also be interpreted as operating conditions that can be used to determine when re-calibration should be initiated. Furthermore, other parameters, such as ambient temperature, radiation level, humidity, etc., describing the external environment of the A/D converter could also be used to trigger re-calibration.

If one or several of the operating condition parameters are near the limit of their respective specified operating range (near one or several dashed lines in FIG. 7), it may be advantageous to enable continuous background calibration.

In order to reduce the influence of noise and glitches, and to generally improve the accuracy of estimated calibration coefficients, averaging of coefficients from multiple calibration sequences may be used to statistically refine the calibration.

One of the advantages of the present invention over the prior art is that it allows unnecessary background calibration to be suppressed. By suppressing the background calibration when operating conditions are stable, the signal flow through the A/D-converter is not interrupted, and therefore the bit-error rate is improved.

Another advantage is that suppressing unnecessary background calibration saves power. This feature is especially attractive in battery powered equipment, such as mobile terminals.

The invention represents a generic method, applicable to background calibration of most known A/D converter architectures, and therefore covers a large number of applications, not only those related to digital radio systems.

The present invention is not limited to a particular calibration scheme. Instead, by using the present invention it becomes possible to improve the overall system performance while using one of a wide range of novel and existing background calibration schemes.

Furthermore, the present invention is not limited to the interpolation-type skip-and-fill background calibration used for illustration. It is equally applicable to any background calibration that occasionally disturbs the data-flow through the main conversion path. As an example, it is possible to use a lower performance auxiliary A/D converter for sampling the samples that are skipped by the main A/D converter.

It will be understood by those skilled in the art that various modifications and changes may be made to the present invention without departure from the scope thereof, which is defined by the appended claims.

REFERENCES

[1] U.S. Pat. No. 5,499,027, A. N. Karanicolas, and H.-S. Lee, "Digitally self-calibrating pipeline analog-to-digital converter".
[2] O. E. Erdogan, P. J. Hurst, and S. H. Lewis, "A 12b Digital-Background-Calibrated Algorithmic ADC with −90 dB THD", 1999 *Intl. Solid-State Circ. Conf.*, pp. 316–317, February 1999, IEEE.
[3] U.-K. Moon, and B.-S. Song, "Background Digital Calibration Techniques for Pipelined ADC's", *IEEE Trans. Circ. Syst.-II*, pp. 102–109, Vol. 44, No. 2, February 1997, IEEE.
[4] S.-U. Kwak, B.-S. Song, and K. Bacrania, "A 15-b, 5-Msample/s Low-Spurious CMOS ADC", *IEEE J. Solid-State Circ.*, pp. 1866–1875, Vol. 32, No. 12, December 1997, IEEE.
[5] B. Razavi, "Design of Analog CMOS Integrated Circuits", McGraw-Hill, pp. 361–388.

What is claimed is:

1. An A/D converter background calibration method comprising:
    repeatedly determining a measure representing at least one operating condition parameter change since a last background calibration;
    performing a new background calibration if said measure exceeds a predetermined change value and if the time elapsed since the last background calibration exceeds a predetermined time value.

2. An A/D converter background calibration method comprising:
    repeatedly determining a measure representing at least one operating condition parameter change since a last background calibration;
    performing continuous background calibration if said measure exceeds a predetermined change value and if the at least one operating condition parameter is near a limit of its specified operating range.

3. An A/D converter background calibration method comprising:
    repeatedly determining a measure representing at least one operating condition parameter change since a last background calibration;
    performing a new background calibration if said measure exceeds a predetermined change value; and
    stretching background calibration sequences in time if said measure seldom exceeds said predetermined change value.

4. An A/D converter background calibration method comprising:
    repeatedly determining a measure representing at least one operating condition parameter change since a last background calibration;
    performing a new background calibration if said measure exceeds a predetermined change value; and
    compressing background calibration sequences in time if said measure often exceeds said predetermined change value.

5. An A/D converter background calibration method comprising:
    repeatedly determining a measure representing at least one operating condition parameter change since a last background calibration;
    performing a new background calibration if said measure exceeds a predetermined change value; and
    wherein the at least one operating condition parameter comprises semiconductor junction temperature.

6. An A/D converter background calibration method comprising:
    repeatedly determining a measure representing at least one operating condition parameter change since a last background calibration;
    performing a new background calibration if said measure exceeds a predetermined change value; and
    wherein the at least one operating condition parameter comprises supply voltage.

7. An A/D converter background calibration method comprising:
    repeatedly determining a measure representing at least one operating condition parameter change since a last background calibration;
    performing a new background calibration if said measure exceeds a predetermined change value; and
    wherein the at least one operating condition parameter comprises bias current.

8. An A/D converter background calibration method comprising:
    repeatedly determining a measure representing at least one operating condition parameter change since a last background calibration;
    performing a new background calibration if said measure exceeds a predetermined change value; and
    wherein the at least one operating condition parameter comprises a system-level detectable performance parameter.

9. The method of claim 8, wherein said system-level detectable performance parameter is a bit-error rate.

10. An A/D converter background calibration apparatus comprising:
    a change detector which repeatedly determines a measure representing at least one operating condition parameter change since a last background calibration; and a calibration control unit which performs a new background calibration if said measure exceeds a predetermined change value and if the time elapsed since the last background calibration exceeds a predetermined time value.

11. The method of claim 10, wherein the at least one operating condition parameter describes the external environment of the A/D converter.

12. The apparatus of claim 10, including means for measuring at least one operating condition parameter describing the external environment of the A/D converter.

13. An A/D converter background calibration apparatus comprising:

a change detector Which repeatedly determines a measure representing at least one operating condition parameter change since a last background calibration; and a calibration control unit which performs a continuous background calibration if said measure exceeds a predetermined change value and if at the least one operating condition parameter is near a limit of its specified operating range.

14. An A/D converter background calibration apparatus comprising:

a change detector which repeatedly determines a measure representing at least one operating condition parameter change since a last background calibration; and a calibration control unit which performs a new background calibration if said measure exceeds a predetermined change value and which stretches background calibration sequences in time if said measure seldom exceeds said predetermined change value.

15. An A/D converter background calibration apparatus comprising:

a change detector which repeatedly determines a measure representing at least one operating condition parameter change since a last background calibration; and a calibration control unit which performs a new background calibration if said measure exceeds a predetermined change value and which compresses background calibration sequences in time if said measure often exceeds said predetermined change value.

16. An A/D converter background calibration apparatus comprising:

a change detector which repeatedly determines a measure representing at least one operating condition parameter change since a last background calibration;

a calibration control unit which performs a new background calibration if said measure exceeds a predetermined change value; and means for measuring semiconductor junction temperature.

17. An A/D converter background calibration apparatus comprising:

a change detector which repeatedly determines a measure representing at least one operating condition parameter change since a last background calibration;

a calibration control unit which performs a new background calibration if said measure exceeds a predetermined change value; and means for measuring supply voltage.

18. An A/D converter background calibration apparatus comprising:

a change detector which repeatedly determines a measure representing at least one operating condition parameter change since a last background calibration;

a calibration control unit which performs a new background calibration if said measure exceeds a predetermined change value; and means for measuring bias current.

19. An A/D converter background calibration apparatus comprising:

a change detector which repeatedly determines a measure representing at least one operating condition parameter change since a last background calibration;

a calibration control unit which performs a new background calibration if said measure exceeds a predetermined change value; and means for measuring a system-level detectable performance parameter.

20. An A/D converter background calibration apparatus comprising:

a change detector which repeatedly determines a measure representing at least one operating condition parameter change since a last background calibration;

a calibration control unit which performs a new background calibration if said measure exceeds a predetermined change value; and means for measuring a bit-error rate.

* * * * *